United States Patent [19]

Yabe et al.

[11] Patent Number: 4,954,308

[45] Date of Patent: Sep. 4, 1990

[54] RESIN ENCAPSULATING METHOD

[75] Inventors: Isao Yabe, Tokorozawa; Katsuji Komatsu, Kawagoe; Hiroyuki Kaneko, Hoya, all of Japan

[73] Assignee: Citizen Watch Co., Ltd., Tokyo, Japan

[21] Appl. No.: 290,227

[22] Filed: Dec. 27, 1988

[30] Foreign Application Priority Data

Mar. 4, 1988 [JP] Japan ................................ 63-50738
Mar. 15, 1988 [JP] Japan ................................ 63-59409

[51] Int. Cl.⁵ ...................... B29C 45/02; B29C 45/14
[52] U.S. Cl. .......................... 264/272.17; 264/328.12; 425/116; 425/125
[58] Field of Search ............. 264/272.17, 328.12; 249/91, 95; 425/116, 121, 125

[56] References Cited

U.S. PATENT DOCUMENTS

| | | | |
|---|---|---|---|
| 4,332,537 | 6/1982 | Slepcevic | 425/121 |
| 4,368,168 | 1/1983 | Slepcevic | 264/272.14 |
| 4,442,056 | 4/1984 | Slepcevic | 264/161 |
| 4,480,975 | 11/1984 | Plummer et al. | 425/116 |
| 4,741,507 | 5/1988 | Baird | 249/91 |
| 4,746,392 | 5/1988 | Hoppe | 264/272.17 |

FOREIGN PATENT DOCUMENTS

| | | | |
|---|---|---|---|
| 0113692 | 7/1984 | European Pat. Off. | |
| 32139 | 2/1984 | Japan | 425/121 |
| 4234 | 1/1986 | Japan | 264/272.17 |
| 144033 | 7/1986 | Japan | 264/272.17 |
| 62-13312 | 10/1986 | Japan | . |
| 61-46049 | 1/1987 | Japan | . |
| 1069095 | 11/1963 | United Kingdom | . |

Primary Examiner—James Lowe
Attorney, Agent, or Firm—Townsend and Townsend

[57] ABSTRACT

A resin encapsulating method includes the steps of mounting a plate having a gate groove on a substrate to form a side gate, connected to the side surface of a cavity, between the plate and one of the upper and lower half molds, and filling a resin in the cavity.

6 Claims, 10 Drawing Sheets

RESIN ENCAPSULATING METHOD

BACKGROUND OF THE INVENTION

1. Field of the Invention

The present invention relates to a method of encapsulating an electronic part such as an IC formed on a substrate with a thermosetting resin.

2. Description of the Prior Art

Recently, an IC card having an IC chip such as a CPU or a memory chip has been rapidly developed. Since such an IC card has a larger memory capacity than that of a conventional magnetic card, it is proposed to use the IC card in place of a bankbook or a credit card.

A conventional IC card and an IC module housed therein will be described below with reference to FIGS. 1 to 7.

As shown in FIG. 1, a plurality of data input/output terminals 33a are formed on the surface of an IC card 30. The overall shape of the IC card 30 is defined by a plastic card base 31 shown in FIG. 3.

As shown in FIG. 2, a recess portion 31a is formed in the card base 31. An IC module 32 in which an IC chip 33b such as a CPU or a memory chip is bonded on a substrate 33 and a resin encapsulating portion 34 is formed to cover the IC chip 33b is housed and fixed in the recess portion 31a.

After the IC module 32 is housed and fixed in the recess portion 31a of the card base 31, over sheets 35 are covered on both the surfaces of the card base 31, thereby constituting the IC card 30.

Referring to FIG. 2, the upper surface of the encapsulating portion 34 abuts against the bottom surface of the recess portion 31a to define the thickness of the IC module 32, and the outer circumference of the substrate 33 engages with the inner circumference of the recess portion 31a to define its horizontal position.

The IC card 30 generally has a thickness of about 0.8 mm and requires flexibility against bending to some extent so as not to be broken by an external force applied when it is carried or used. For this reason, the card base 31 must have flexibility, and the IC module 32 must be encapsulated with a resin having high stiffness and humidity resistance so that the IC chip 33b is not broken or a bonding wire is not disconnected by bending.

In addition, since the upper surface of the encapsulating portion 34 abuts against the bottom surface of the recess portion 31a of the thin card base 31 to define the thickness, the size of the encapsulating portion 34 must be controlled to prevent thickness variations. In a conventional potting encapsulating method, however, which has been widely used and in which a molten resin is dropped on the IC chip, the thickness of the encapsulating portion 34 tends to vary. Therefore, a transfer molding method using a thermosetting resin having high dimensional precision and stiffness is best suited to formation of the encapsulating portion 34 of the IC module.

A method of resin-encapsulating an IC chip according to conventional transfer molding will be described below with reference to FIG. 4.

Referring to FIG. 4, reference numeral 36 denotes a lower half mold. The substrate 33 on which the IC chip 33b is bonded is placed on the upper surface of the lower half mold 36. Reference numeral 37 denotes an upper half mold in which a cavity 37a is formed. The upper half mold 37 is fixed on the lower half mold 36 so that the cavity 37a covers the upper surface of the IC chip 33b.

A gate groove 39a and a runner groove 40a are formed in the upper half mold 37. A runner 40 and a gate 39 for guiding a resin 38 to the cavity 37a are formed between the faces of the upper and lower half molds 37 and 36 and between the faces of the upper half mold 37 and the substrate 33, respectively. This arrangement corresponds to a so-called side gate type transfer molding method.

In order to form the encapsulating portion 34, the heated and melted resin 38 is injected into the runner 40 by a plunger 41 and filled in the cavity 37a through the gate 39.

When the resin 38 is set, the upper half mold 37 is removed to extract the IC module 32 in which the encapsulating portion 34 is formed. In this case, however, the gate 39 is formed between the faces of the upper half mold 37 and the substrate 33 as described above. Therefore, as shown in FIG. 5, a gate remaining portion 34a connected to the encapsulating portion 34 is formed on the substrate 33 of the IC module 32.

The gate remaining portion 34a has high adhesion strength with respect to a surface 33c of the substrate 33. Therefore, when a gate remaining portion 34a' indicated by an alternate long and dashed line is to be bent and removed, a bending force acts on the gate remaining portion 34a to remove the surface 33c of the substrate 33. In the worst case, even a circuit pattern is disconnected.

In order not to remove the gate remaining portion 34a', a groove 31b for receiving the gate remaining portion 34a must be additionally formed in the recess portion 31a of the card base 31.

Since the card base 31 is made of a plastic material as described above, the recess portion 31a and the groove 31b are molded at the same time the card base 31 is formed by injection molding. When the recess portion 31a and the groove 31b are to be simultaneously formed in the card base 31 by injection molding, the plastic material in an injection mold flows not through the groove 31b but through portions indicated by arrows B and C as shown in FIG. 3. As a result, the respective plastic flows are incompletely bonded to each other at a position indicated by a broken line D.

As described above, the IC card 30 requires the flexibility against bending If the above plastic incomplete bonded portion D is formed in the card base 31, however, a crack is produced from the incomplete bonded portion D even by slight bending to break the card base 31.

In order not to form the groove 31b in the card base 31, therefore, a demand has arisen for a transfer molding method which can encapsulate the IC chip 32 without forming the gate remaining portion 34a on the substrate 33 of the IC module 32.

Japanese Examined Patent Publication (Kokoku) No. 61-46049 discloses a resin encapsulating method which can eliminate the drawback of the above conventional resin encapsulating method.

This resin encapsulating method uses a cavity plate shown in FIG. 6 In addition to positioning pilot holes 42a, a cavity 42b for defining the size of an encapsulating portion is punched in a cavity plate 42. In this resin encapsulating method, as shown in FIG. 7, the substrate 33 on which an electronic part to be encapsulated with a resin is mounted and the cavity plate 42 in which the cavity 42b for defining the position and size of a resin encapsulating portion are interposed between the upper half mold 37 and the lower half mold 36. An encapsulating resin 43 is filled in the cavity through the runner 40 and the gate 39 formed in the upper surface of the lower half mold 36 to be brought into contact with the cavity plate 42. That is, this method is a so-called side gate type transfer molding method.

Note that the gate 39 is located at the upper opening end of the cavity 42b.

According to the above resin encapsulating method, the gate 39 for guiding the encapsulating resin is formed not on the substrate 33 but on the encapsulating portion 34. Therefore, since the gate remaining portion 34a is not formed on the substrate 33 as indicated by the alternate long and dashed line in FIG. 8, the conventional problem shown in FIG. 5 can be solved.

In the above resin encapsulating method, however, the gate groove is positioned at the upper opening portion of the cavity, i.e., the upper end face of the encapsulating portion 34 when the encapsulating resin is filled in the cavity. Therefore, as shown in FIG. 8, the gate remaining portion 34b projects from the upper end face of the encapsulating portion 34.

As shown in FIG. 9, if the IC module 32 having the gate remaining portion 34b is housed in a recess portion 43a. of a card base 43, the gate remaining portion 34b abuts against the bottom surface of the recess portion 43a to form a gap G between the upper surface of the encapsulating portion 34 and the bottom surface of the recess portion 43a. As a result, the thickness of the card is undesirably increased larger than a predetermined thickness at a portion of the IC module 32.

For this reason, the gate remaining portion 34b must be removed by a file after the encapsulating portion 34 is formed. This troublesome operation poses a problem of reliability.

The above resin encapsulating method also has a problem of maintenance of a mold. That is, in order to improve stiffness of the encapsulating portion 34, glass fibers are often mixed in the encapsulating resin.

In this case, since a thin gate groove is strongly worn by the glass fibers, a member having the gate groove must be periodically replaced. According to the above resin encapsulating method, however, since the gate groove is formed in the lower half mold, the expensive lower half mold must be entirely replaced when the gate groove is worn, resulting in a high mold cost.

As countermeasures against wear of the gate groove, a variety of resin molding methods in which only a part of a mold having a gate groove which is strongly worn can be replaced are proposed as disclosed in Japanese Unexamined Patent Publication (Kokai) No. 62-13312.

In this resin encapsulating method, a sprue having a hole for injecting a resin is constituted by a replaceable bushing, and this sprue bushing is located at a stationary insert die. When a cavity formed between the faces of stationary and movable insert dies communicates with the hole of the sprue bushing, a molten resin is injected from an injection cylinder to the hole of the sprue bushing, thereby filling the resin into the cavity. That is, this method is a so-called pin gate type resin molding method.

After the resin is filled and set in the cavity, a molded product and the resin set in the sprue bushing are removed, and resin molding is performed again.

In this resin molding method, since the sprue as a resin injection hole which is worn most strongly is constituted by the replaceable bushing, only the sprue bushing can be easily replaced when the sprue is strongly worn.

In this resin molding method, however, the following difference occurs between molding using a thermoplastic resin and that using a thermosetting resin.

That is, since the thermoplastic resin has a high thermal shrinkage rate, it can be easily released from a mold. In addition, the thermoplastic resin can maintain its toughness even after it is set. Therefore, even a resin set in the hole of the sprue bushing can be easily extracted and removed therefrom.

In contrast, since the thermosetting resin has a low thermal shrinkage rate, it adheres on the surface of a mold and is not easily released therefrom when it is set. In addition, the thermosetting resin almost loses its toughness after it is set. Therefore, when a set resin is to be extracted from the hole of the sprue bushing, the set resin is broken in the hole of the sprue bushing and the resin remains therein.

For this reason, since it is difficult to use the thermosetting resin in this pin gate type resin molding method, the above side gate type transfer molding method is conventionally used.

The resin encapsulating method disclosed in Japanese Examined Patent Publication (Kokoku) No. 61-46049 further has the following problem.

That is, as described above, the thermosetting resin has a low thermal shrinkage rate and therefore is not easily released from a mold. Therefore, when the encapsulating resin is filled in the cavity of the cavity plate for defining the shape of the encapsulating portion to encapsulate the electronic part on the substrate, the encapsulating portion and the cavity plate are kept adhered with each other after the encapsulating resin is set. Therefore, in order to remove the substrate having the encapsulating portion thereon, the substrate with the cavity plate adhered thereto is removed from a mold, the substrate and the cavity plate are manually separated from each other, and then the cavity plate is mounted in the mold. This series of operations must be manually performed because it is difficult to automatically perform them, resulting in very poor production efficiency.

SUMMARY OF THE INVENTION

It is a first object of the present invention to provide a resin encapsulating method in which a gate remaining portion does not project from the upper surface of an encapsulating portion.

It is a second object of the present invention to provide a resin encapsulating method in which a gate groove which is strongly worn can be easily replaced.

It is a third object of the present invention to provide a resin encapsulating method in which a series of resin encapsulating operations can be automatically performed to improve production efficiency.

The above first and second objects of the present invention can be achieved by a resin encapsulating method in which a substrate to be subjected to resin encapsulation is sandwiched between upper and lower half molds, and a resin is filled in a cavity defined between the upper and lower half molds through a gate, comprising the steps of mounting a plate having a gate groove on the substrate to form a side gate, connected to the side surface of the cavity, between the plate and one of the upper and lower half molds, and filling the resin in the cavity.

The above third object of the present invention can be achieved by mounting a plate to be pivotal on one of upper and lower half molds so that the plate is pivoted and separated from a substrate when the upper and lower half molds are separated from each other.

BRIEF DESCRIPTION OF THE ACCOMPANYING DRAWINGS

DETAILED DESCRIPTION OF THE PREFERRED EMBODIMENTS

A resin encapsulating method according to the present invention will be described below with reference to the accompanying drawings.

FIGS. 10A to 10E are sectional views showing encapsulating steps of a resin encapsulating method according to the present invention.

First, parts to be used in the resin encapsulating method of the present invention will be described below with reference to FIG. 10A.

Figure 1:
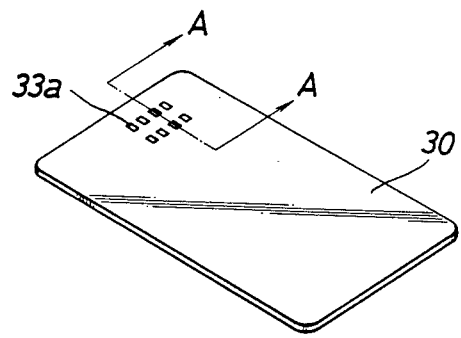
FIG. 1 is a perspective view showing an outer appearance of a conventional IC card.
Figure 2:
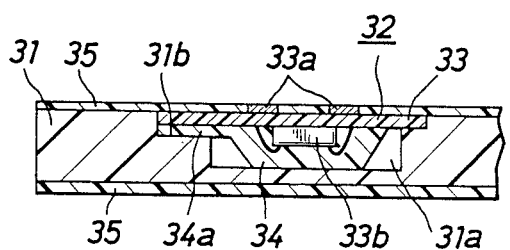
FIG. 2 is a sectional view taken along the line A—A in FIG. 1.
Figure 3:
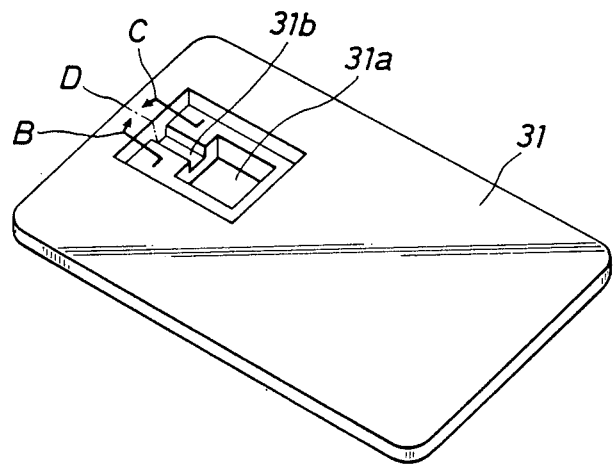
FIG. 3 is a perspective view showing an outer appearance of a card base of the conventional IC card.
Figure 4:
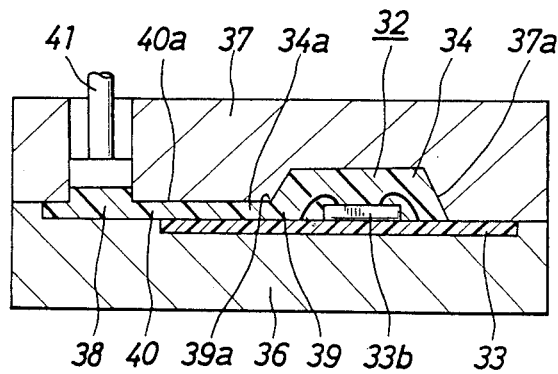
FIG. 4 is a sectional view for explaining encapsulating steps in a conventional IC chip resin encapsulating method.
Figure 5:
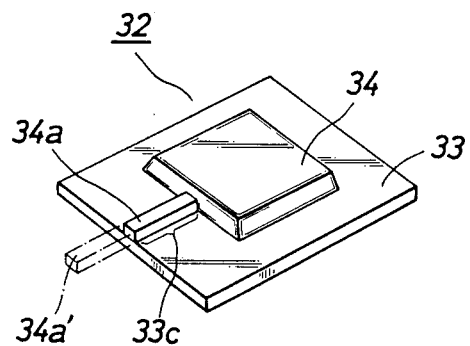
FIG. 5 is a perspective view showing an outer appearance of a conventional IC module.
Figure 6:
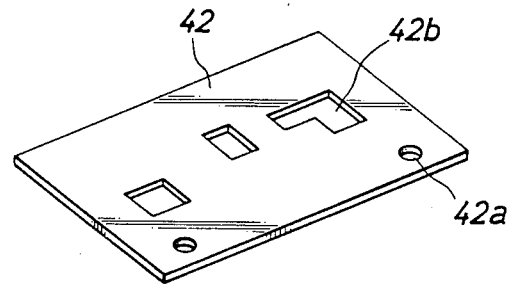
FIG. 6 is a perspective view showing a cavity plate used in a conventional resin encapsulating method.
Figure 7:
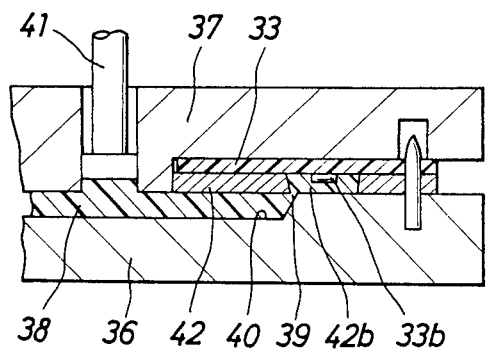
FIG. 7 is a sectional view for explaining encapsulating steps in the conventional resin encapsulating method.
Figure 8:
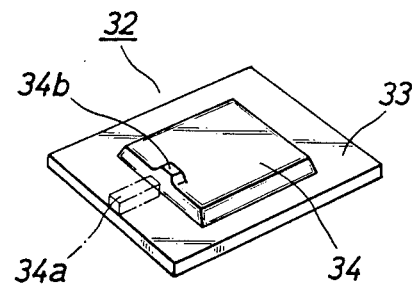
FIG. 8 is a perspective view showing an IC module resin-encapsulated by the method shown in FIG. 7.
Figure 9:
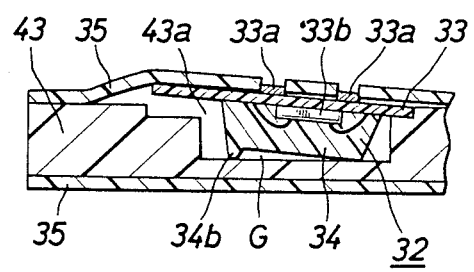
FIG. 9 is a sectional view in which the IC module shown in FIG. 8 is housed in an IC card.
Figure 10A:
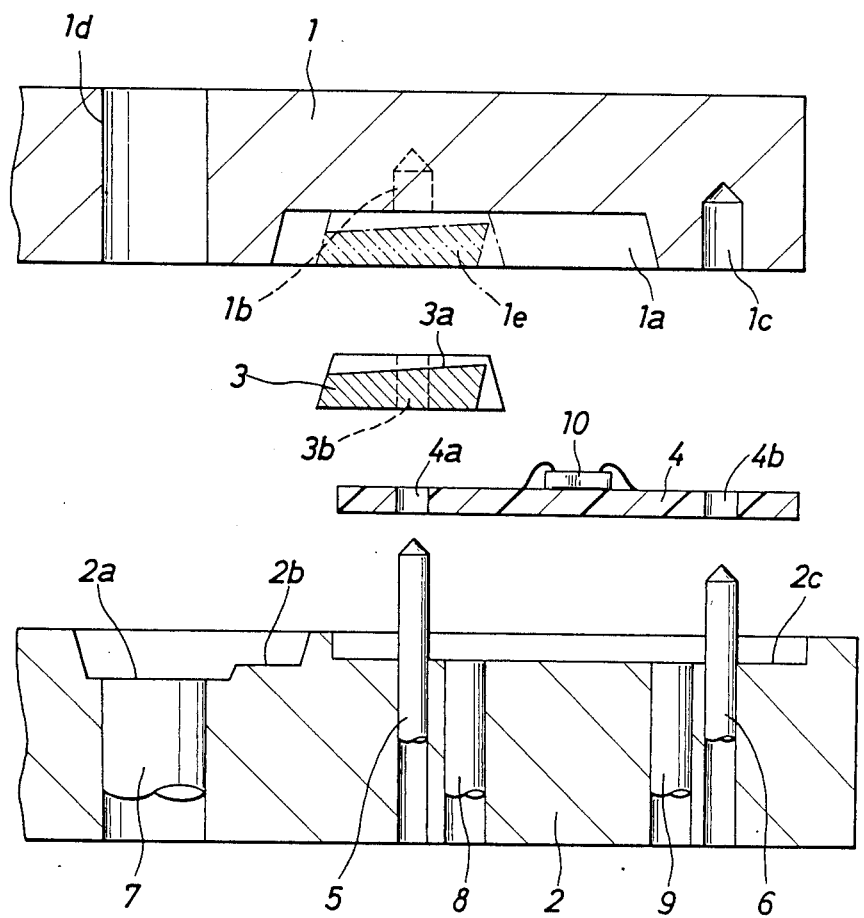
FIGS. 10A to 10E are sectional views showing a main part for explaining encapsulating steps of a resin encapsulating method according to an embodiment of the present invention.

Referring to FIG. 10A, reference numeral 1 denotes an upper half mold. The upper half mold 1 includes an upper cavity 1a for defining the size and position of an encapsulating portion, guide holes 1b and 1c, an upper pot 1d in which an encapsulating resin is received, and a plate portion 1e in which a plate 3 is arranged as an alternate long and dashed line.

Reference numeral 2 denotes a lower half mold. The lower half mold 2 includes a lower pot 2a, a runner groove 2b, and a substrate fixing portion 2c for supporting a substrate 4 having an electronic part 10 thereon.

The lower half mold 2 also includes guide pins 5 and 6 for positioning the substrate 4 and the plate 3, and knockout pins 7, 8 and 9, located below the bottom surfaces of the lower pot 2a and the substrate fixing portion 2c, for extracting the substrate 4 together with a set encapsulating resin from the lower half mold 2 after an encapsulating portion is formed on the substrate 4.

Reference numeral 3 denotes a plate for guiding an encapsulating resin to the upper cavity 1a. As shown in the perspective view of FIG. 11, gate grooves 3a tapered toward the upper cavity 1a (encapsulating portions 13 in FIG. 11) are formed in the upper surface of the plate 3

Guide holes 3b, 4a and 4b are formed in the plate 3 and the substrate 4, respectively, so that the guide pins 5 and 6 are inserted therethrough.

Resin encapsulating steps of this embodiment will be described below with reference to FIGS. 10A to 10E.

A vertical arrangement of the respective parts is as shown in FIG. 10A. The substrate 4 is placed on the substrate fixing portion 2c with the guide pins 5 and 6 of the lower half mold 2 being inserted through the guide holes 4a and 4b, respectively, so that the electronic part 10 faces up. The plate 3 is placed on the upper surface of the substrate 4 with the guide pin 5 being inserted through the guide hole 3b so that the gate groove 3a faces up.

Figure 10B:
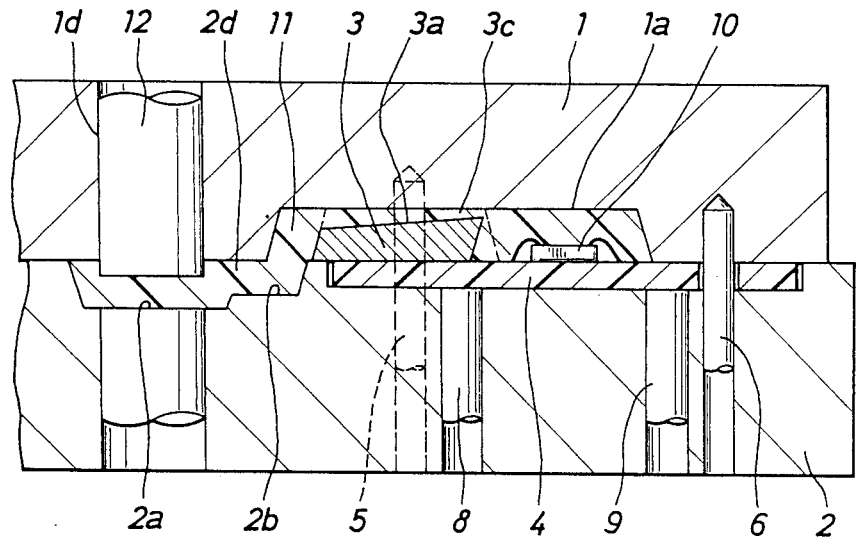

The upper half mold 1 is overlapped on the upper surface of the lower half mold 2 so that the guide holes 1b and 1c correspond to the guide pins 5 and 6 inserted through the plate 3 and the substrate 4. In this manner, as shown in FIG. 10B, the plate 3 is fixed in the plate portion 1e of the upper half mold 1, and the substrate 4 is fixed in the substrate fixing portion 2c of the lower half mold 2. At the same time, a side gate 3c is defined between the gate groove 3a and the upper half mold 1, and a runner 2d is defined between the runner groove 2b of the lower half mold 2 and the upper half mold 1.

The side gate 3c is connected to the side surface of the upper cavity 1a.

As shown in FIG. 10B, an encapsulating resin 11 which is a thermosetting resin mixed with glass fibers is supplied from the upper pot 1d, and heated and melted in the lower pot 2a.

When a plunger 12 for injecting the encapsulating resin 11 is moved downward from the upper pot 1d to the lower pot 2a, the encapsulating resin 11 is filled in the upper cavity 1a through the runner 2d and the side gate 3c, thereby encapsulating only the electronic part 10.

Figure 11:
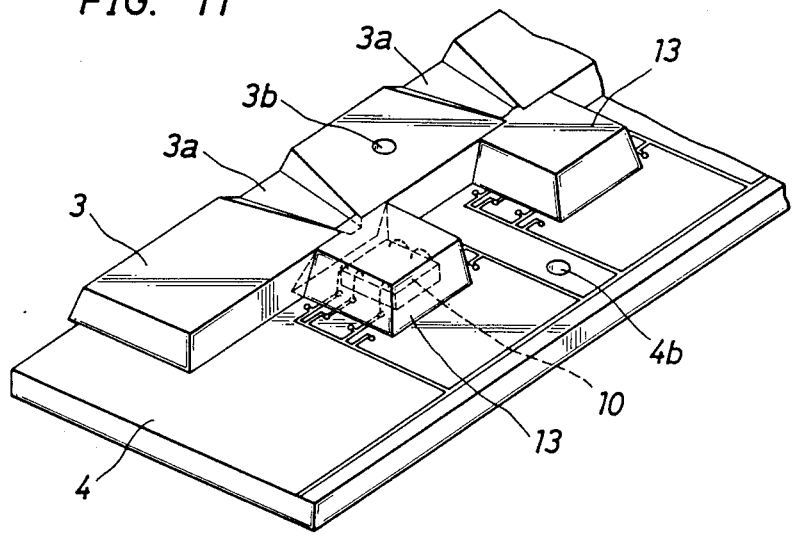
FIG. 11 is a perspective view in which a plate is mounted on a substrate encapsulated by the steps shown in FIGS. 10A to 10E.

As shown in FIG. 11, although the gate groove 3a of the plate 3 tends to be worn from its tapered distal end portion, only the plate 3 can be replaced when the gate groove 3a is worn.

After the encapsulating resin 11 filled in the upper cavity 1a is set and the encapsulating portion 13 of the substrate 4 is formed, the upper half mold 1 is removed upward.

Figure 10C:
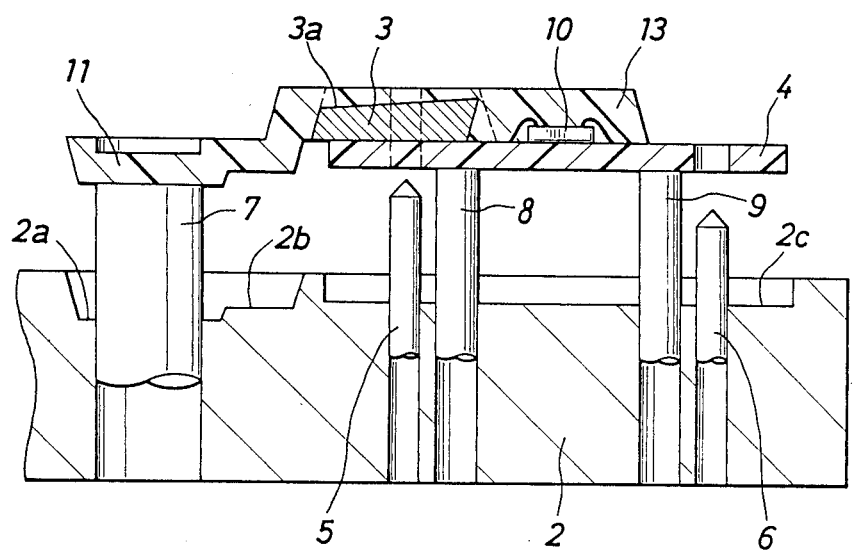

As shown in FIG. 10C, by projecting upward the knockout pins 7, 8 and 9, the substrate 4 having the encapsulating portion 13 formed thereon is removed together with the encapsulating resin 11 in the gate 3c, the runner 2d and the lower pot 2a set continuously with the encapsulating portion 13 from the guide pins 5 and 6 of the lower half mold 2.

Figure 10D:
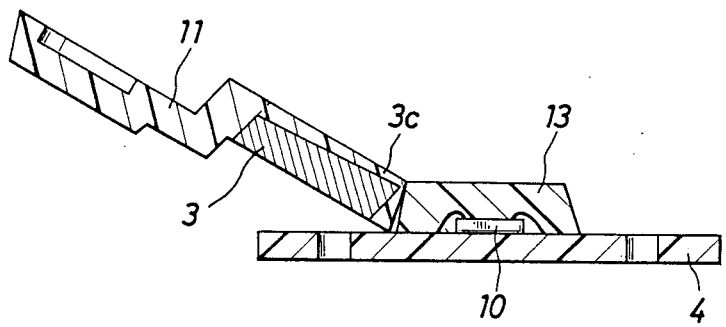
Figure 13:
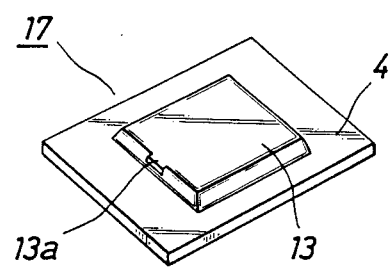
FIG. 13 is a perspective view showing an outer appearance of an IC module resin-encapsulated by the embodiment of the present invention.

As shown in FIG. 10D, by bending the side gate 3c upward or to the right or left, the unnecessary encapsulating resin 11 can be easily removed from the encapsulating portion 13. The substrate 4 is then cut into a predetermined shape to complete an individual IC module 17 as shown in FIG. 13.

In addition, since the side gate 3c described above is connected to the side surface of the encapsulating portion 13, the gate remaining portion 13a projects from the side surface of the encapsulating portion 13.

Referring to FIG. 11, the plate 3 is mounted on the substrate 4 on which the encapsulating portion 13 is formed in the above manner.

Figure 14:
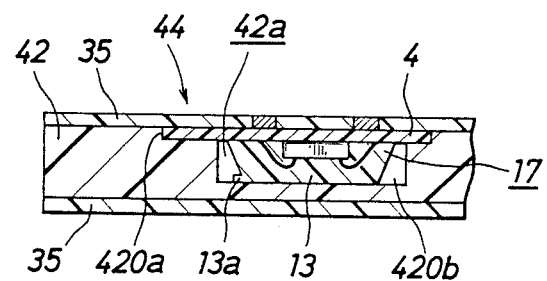
FIG. 14 is a sectional view showing a main part of an IC card adopting the IC module resin-encapsulated by the present invention.

As shown in FIG. 14, with this IC module 17, the encapsulating portion 13 can be accurately housed in the recess portion 42a of the card base 42. Finally, both the surfaces of the card base 42 are covered with over sheets 35 to complete an IC card 44. In this case, as described above with reference to the conventional technique, the horizontal position of the IC module 17 is defined because the circumferential surface of the substrate 4 engages with the inner surface of a substrate recess portion 420a. Therefore, the gate remaining portion 13a projecting from the side surface of the encapsulating portion 13 can be easily housed by setting the inner diameter of an encapsulating recess portion 420b for housing the encapsulating portion 13 larger than the outer diameter of the encapsulating portion 13.

Figure 10E:
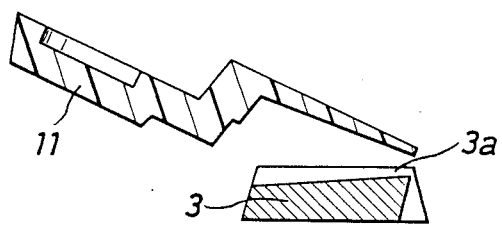

As shown in FIG. 10E, the plate 3 can be reused because the set encapsulating resin 11 is easily removed from the gate groove 3a.

In order to easily remove the encapsulating resin 11 from the gate groove 3a, it is preferred to finish the surface of the gate groove 3a as fine as possible. In addition, a mold release agent may be coated on the gate groove 3a beforehand.

Figure 12:
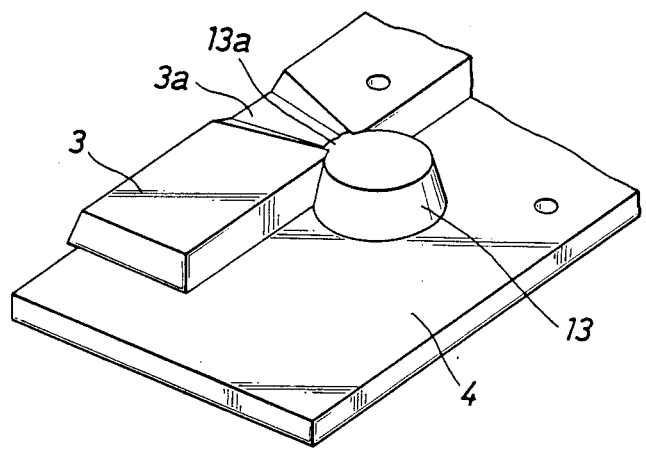
FIG. 12 is a perspective view showing state in which a plate is mounted on a substrate having a circular encapsulating portion formed thereon.

In the above embodiment, the shape of the encapsulating portion 13 is square. The shape of the encapsulating portion 13, however, can be arbitrarily changed to be, e.g., a circle as shown in FIG. 12.

Figure 15:
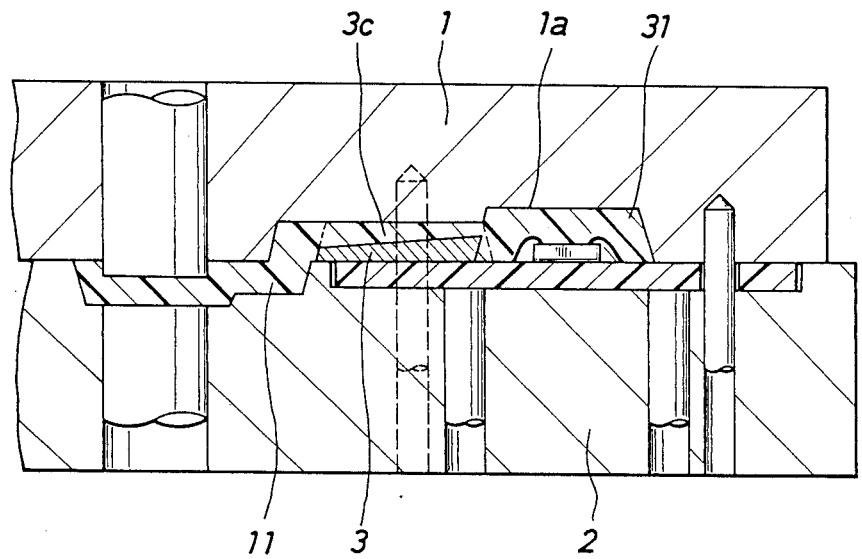
FIG. 15 is a sectional view showing a main part for explaining encapsulating steps for executing the resin encapsulating method according to the present invention using a modified mold.

FIG. 15 shows a modification of the mold used in the resin encapsulating method according to the present invention. In FIG. 15, the same reference numerals as in FIGS. 10A to 10B denote the same parts.

In this mold, a side gate 3c formed by a plate 3 is connected to a side surface central portion of an upper cavity 1a formed in an upper half mold 1 and can be therefore removed at a position separated further from the upper end of an encapsulating portion 31.

A second embodiment of the present invention will be described below with reference to FIGS. 16A to 16C and 17.

Figure 16A:
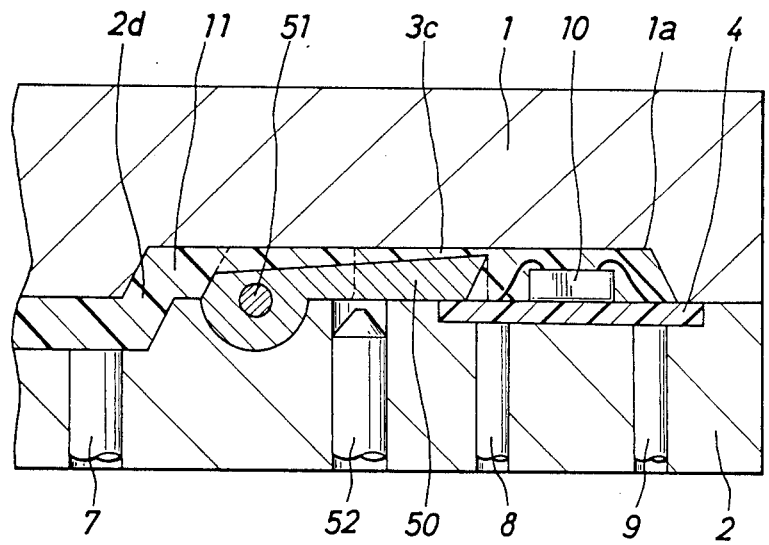
FIGS. 16A to 16C are sectional views showing a main part for explaining encapsulating steps in the resin encapsulating method according to still another embodiment of the present invention.
Figure 16B:
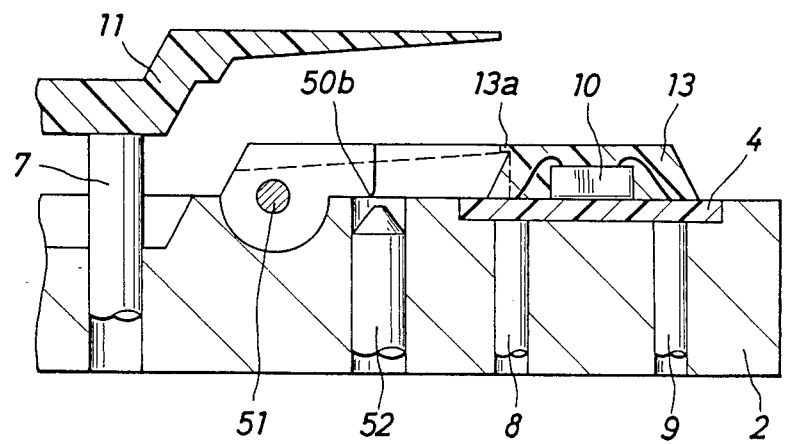
Figure 16C:
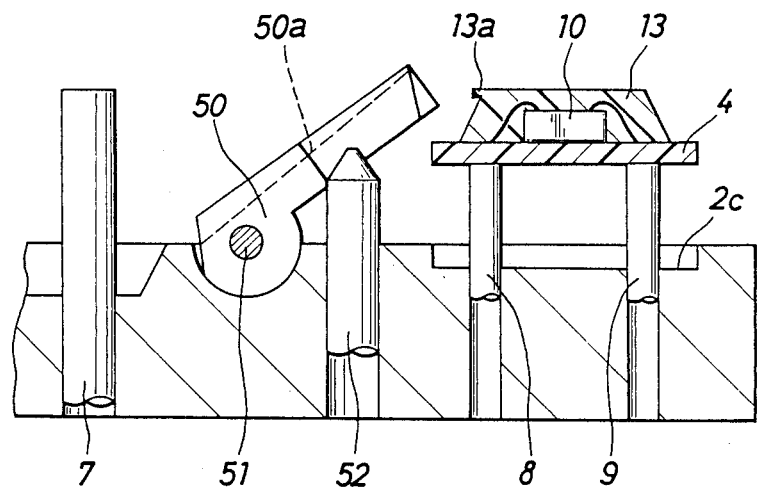
Figure 17:
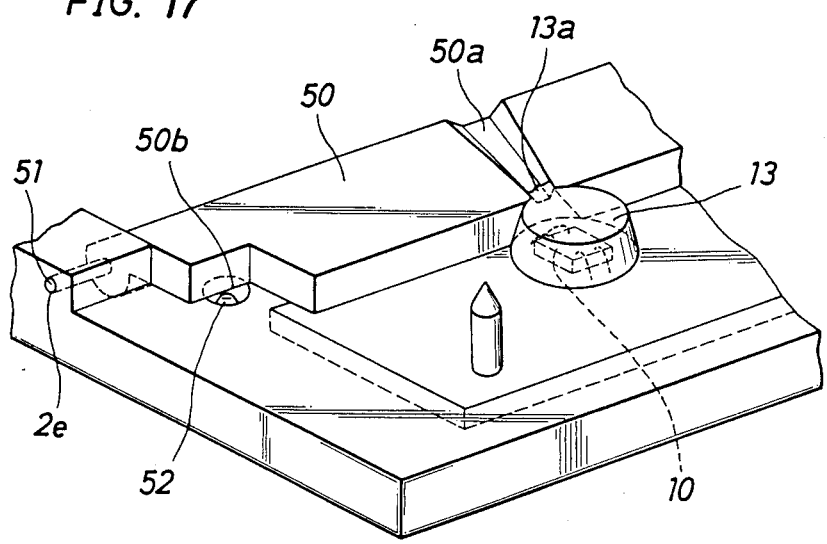
FIG. 17 is a perspective view in which a plate is mounted on a substrate.

First, parts used in the third embodiment will be described below with reference to FIGS. 16 and 17. Note that the same reference numerals as in the first embodiment denote parts having the same functions, and a detailed description thereof will be omitted.

A significant feature of this embodiment is that a plate 50 is pivotally mounted on a lower half mold 2. That is, a rotational shaft 51 is included in the plate 50 and rotatably supported by a bearing portion 2e formed in the lower half mold 2. The lower half mold 2 includes a push pin 52 which vertically moves as a driving means for pivoting the plate 50. The distal end of the push pin 52 is tapered. When the push pin 52 moves upward, the tapered surface abuts against an end portion 50b of the plate 50 to pivot the plate 50 upward. When the push pin 52 moves downward, the tapered surface pivots the plate 50 downward.

Resin encapsulating steps of the second embodiment will be described below with reference to FIGS. 16 and 16C.

While the push pin 52 pivots upward the plate 50, the substrate 4 is placed on a substrate fixing portion 2c of the lower half mold 2. The push pin 52 is then moved downward as shown in FIG. 16 so that the plate 50 is placed on the upper surface of the substrate 4 and clamped from the above by the upper half mold 1. In this manner, an electronic part 10 is surrounded by an upper cavity 1a. At the same time, a side gate 3c is defined between the upper half mold 1 and the plate 50, and a runner 2d is defined between the upper and lower half molds 1 and 2.

An encapsulating resin 11 injected by a plunger (not shown) is filled in the upper cavity 1a through the runner 2d and the side gate 3c, thereby encapsulating only the electronic part 10.

After the encapsulating resin 11 filled in the upper cavity 1a is set and an encapsulating portion 13 is formed in the substrate 4, the upper half mold 1 is removed upward. As shown in FIG. 16B, a knockout pin 7 is first projected upward to remove the unnecessary encapsulating resin 11 set in the runner 3d and the side gate 3c. At this time, since a gate groove 50a is tapered toward the encapsulating portion 13 as shown in FIG. 17, only a very small gate remaining portion 13a is formed on the side surface of the encapsulating portion 13.

The push pin 52 is then driven upward to pivot the plate 50 upward so that the plate 50 is removed from the upper surface of the substrate 4. Knockout pins 8 and 9 are then projected upward to remove a complete IC module from the substrate fixing portion 2c.

Finally, the knockout pins 7, 8 and 9 are moved downward to set the new substrate 4 not having the encapsulating portion 13 thereon on the substrate fixing portion 2c.

In this embodiment, therefore, the plate 50 need not be removed from the lower half mold each time the encapsulating step is performed. In addition, the plate 50 can be smoothly released from the substrate 4 on which the encapsulating portion 13 is formed, and the set unnecessary encapsulating resin 11 can be smoothly released from the gate plate 50. Therefore, this resin encapsulating method can be automatically performed.

In the above embodiments, the cavity is formed in the upper half mold. The cavity, however, may be formed in the lower half mold to achieve the same effects.

As has been described above, according to the present invention, the plate in which the gate groove is formed is interposed between the upper and lower half molds to form the side gate at a position separated from the substrate surface, and the encapsulating resin consisting of a thermosetting resin is injected in the cavity through the side gate. Therefore, in the complete module, the gate remaining portion can be formed not on the substrate nor the encapsulating portion upper surface but on the encapsulating portion side surface. As a result, the module can be suitably mounted in an IC card or the like requiring thin encapsulation.

In addition, since a side gate structure is adopted in the present invention, the gate portion is not stuffed with the resin. Also, when the gate groove is worn, only the plate which can be easily manufactured at low cost can be replaced in place of an expensive mold, resulting in advantageous maintenance of the mold.

Furthermore, in the present invention, the plate is pivotally mounted on the upper or lower half mold, and the driving means is adopted to remove the plate from the substrate while the upper and lower half molds are separated from each other. Therefore, the plate need not be removed from the mole each time the encapsulating step is performed, and removal of the unnecessary encapsulating resin and handling of the complete IC module can be easily performed. As a result, there is provided a resin encapsulating method most suitable for an automatic operation. That is, the present invention has a significant effect in a module encapsulating method using a thermosetting resin.

What is claimed is:

1. (New) A method of resin encapsulating an electronic part mounted on a flat resin circuit board having metallic wiring thereon, the method comprising the steps of:

sandwiching said circuit board between a first mold and a second mold so as to position said electronic part in a cavity formed by at least the first mold wherein said electronic part is disposed within said cavity;

selecting a gate plate having a gate groove formed on one surface thereof;

arranging said gate plate adjacent to said cavity on an intermediate portion of a surface of the circuit board, the intermediate portion being spaced from the edge of the circuit board;

orienting said gate plate such that said gate groove faces a surface of said mold opposite the surface on which said circuit board is disposed and forming a side gate between said first mold and said gate groove, thereby connecting said side gate to a side surface of said cavity at a position spaced from an upper surface of said circuit board; and filling said cavity with resin through said side gate.

2. A method according to claim 1, wherein said step of sandwiching said circuit board comprises positioning said electronic part in a polygonal cavity such that said plate forms at least one side of said cavity.

3. A method according to claim 1 wherein said step of filling said cavity includes encapsulating said electronic part and wherein said circuit board remains unencapsulated.

4. A method according to claim 1, wherein said step of selecting a gate plate comprises selecting a gate plate wherein said gate groove is tapered.

5. A method according to claim 1, wherein said step of orienting said gate plate comprises forming said side gate connected to a side surface of said cavity at a position spaced apart from one of said first and second molds.

6. A method according to claim 1, further comprising the additional steps of separating the first and second molds from each other; pivotally mounting said plate on one of said first and second molds; and pivotally removing said plate from said board by driving means after said first and second molds are separated from each other.

* * * * *